(12) United States Patent
Uchiyama

(10) Patent No.: US 6,573,591 B2
(45) Date of Patent: *Jun. 3, 2003

(54) SPHERICAL SEMICONDUCTOR DEVICE AND METHOD OF MOUNTING THE SAME ON A SUBSTRATE

(75) Inventor: Kenji Uchiyama, Hotaka-machi (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/511,032

(22) Filed: Feb. 23, 2000

(65) Prior Publication Data

US 2002/0074655 A1 Jun. 20, 2002

(30) Foreign Application Priority Data

Mar. 30, 1999 (JP) .............................. 11-090011

(51) Int. Cl.⁷ ............................................... H01L 23/02
(52) U.S. Cl. ....................................... 257/678; 257/459
(58) Field of Search .................. 257/459, 678, 257/785, 701, 797

(56) References Cited

U.S. PATENT DOCUMENTS

| | | | | |
|---|---|---|---|---|
| 4,451,968 A | * | 6/1984 | Jensen et al. .................. | 29/572 |
| 5,877,943 A | | 3/1999 | Ramamurthi | |
| 5,893,508 A | * | 4/1999 | Oh .............................. | 228/4.5 |
| 5,894,173 A | * | 4/1999 | Jacobs et al. ............... | 257/737 |
| 5,945,725 A | * | 8/1999 | Ishikawa ..................... | 257/531 |
| 5,955,776 A | | 9/1999 | Ishikawa | |
| 6,031,284 A | * | 2/2000 | Song ........................... | 257/701 |
| 6,046,910 A | * | 4/2000 | Ghaem et al. ............... | 361/760 |
| 6,052,517 A | | 4/2000 | Matsunaga et al. | |
| 6,188,127 B1 | * | 2/2001 | Senba et al. ................ | 257/686 |
| 6,204,545 B1 | * | 3/2001 | Nakata ........................ | 257/459 |

FOREIGN PATENT DOCUMENTS

| | | | |
|---|---|---|---|
| JP | | 3-83697 | 4/1991 |
| JP | | 406169151 A | * 6/1994 |
| JP | | 11-354661 | 12/1999 |

OTHER PUBLICATIONS

Ball Semiconductor Co., Ltd., Nikkei Micro Device (No. 157), pp 84–85, Jul. 1, 1998.

* cited by examiner

*Primary Examiner*—Nathan J. Flynn
*Assistant Examiner*—Leonardo Andújar

(57) ABSTRACT

A semiconductor device in which electrical connection between a spherical semiconductor and a substrate can be reliably effected and a method of manufacturing such a semiconductor device. The spherical semiconductor includes contact pads that are treated to create a higher wettability with the fixative material (e.g. solder) then the wettability of the semiconductor material surrounding the contact pads. The substrate includes terminal which may be similarly treated to create a higher wettability with the solder than that of the substrate material surrounding the terminals. The difference in wettability and the surface tension of solder creates a biasing force that causes the contact pads and terminal to bond in an aligned manner. Additionally, the substrate may include a recess 150 in the area where the spherical semiconductor 11 is mounted, with terminals 151 being formed in this recess 150. The center of balance of the spherical semiconductor 11 is deviated, so that, when micro-vibrations are imparted to the substrate, a predetermined part of the spherical semiconductor 11 is directed downward, resulting in the contact pads 111 of the spherical semiconductor 11 being aligned with the contact pads 151 of the substrate 15.

15 Claims, 4 Drawing Sheets

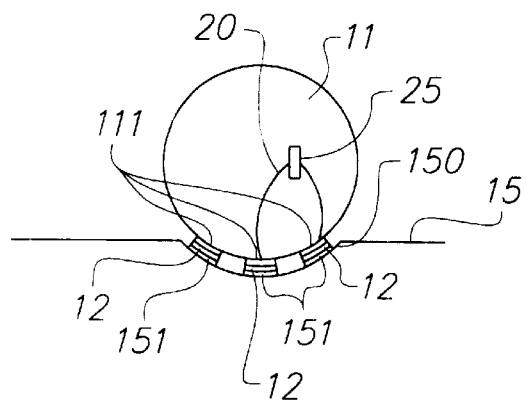
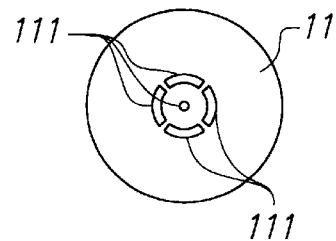
FIG. 5A  FIG. 5B
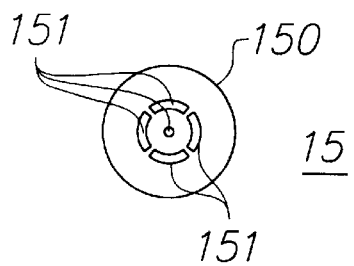
FIG. 5C
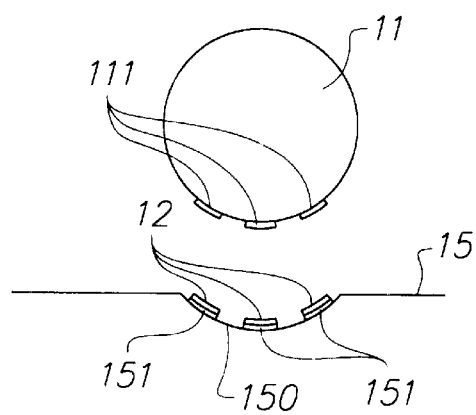
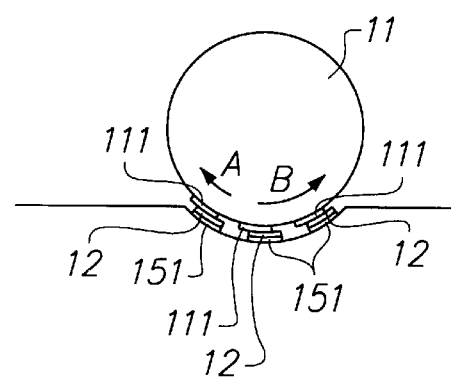
FIG. 6A  FIG. 6B

SPHERICAL SEMICONDUCTOR DEVICE AND METHOD OF MOUNTING THE SAME ON A SUBSTRATE

FIELD OF THE INVENTION

The present invention relates to a semiconductor device for mounting a spherical shaped semiconductor on a substrate. Further, it relates to a method of mounting the spherical shaped semiconductor on the substrate. More specifically, it relates to an alignment technique for aligning the spherical semiconductor with the substrate.

BACKGROUND OF THE INVENTION

In the manufacturing of a semiconductor device, various semiconductor elements have conventionally been formed on the surface of a wafer-shaped semiconductor substrate. In contrast, Ball Semiconductor, Inc has disclosed, in "Nikkei Micro Device" issued on Jul. 1, 1998 and U.S. Pat. No. 5,877,943, etc., a technique for manufacturing a semiconductor device by using a spherical shaped semiconductor in which a semiconductor element is formed on the surface of a spherical semiconductor material (silicon). This spherical semiconductor exhibits a higher area/volume ratio as compared with the wafer-shaped semiconductor substrate, so that it is advantageous in that a large surface area can be ensured with a little amount of semiconductor material. A spherical shaped semiconductor material can be obtained, for example, by melting a granular polycrystalline semiconductor material having a diameter of approximately 1 mm in an argon atmosphere at a temperature of 1000° C. to 10000° C. using inductively coupled plasma to convert it into a monocrystal semiconductor material.

On the surface of such a spherical semiconductor material, it is possible to form various semiconductor elements by using, for example, an exposure method as shown in FIG. 7. In this exposure method, light transmitted through a mask is reflected toward a spherical semiconductor material 10 by mirrors 31, 32, 33, etc. arranged so as to surround the spherical semiconductor material 10, whereby the surface of the semiconductor material 10 is collectively exposed. In the etching process and the film formation process, etching gas, material gas, etc. are caused to flow through a pipe, and also the spherical semiconductor material 10 is caused to flow through a pipe.

The spherical semiconductor with various semiconductor elements formed on the spherical semiconductor material 10 as described above is then mounted on a substrate 15 in a manner as shown, for example, in FIG. 8, to form a semiconductor device 1. In this semiconductor device 1, each of three spherical semiconductors 11 is electrically connected to the substrate 15, and two of the three spherical semiconductors 11 are electrically connected to each other.

The semiconductor device 1 using such spherical semiconductors 11 will be mounted on various apparatus in the near future. At present, however, a technique has not yet been established that enables the spherical semiconductors 11 to be mounted on the substrate 15. When forming a conventional semiconductor device, semiconductor elements are incorporated in a semiconductor substrate shaped in plane, so that electrical connection is effected by using contact pads formed on plane surface, whereas, in the case in which the spherical semiconductor 11 is used, it is necessary to effect electrical connection by using contact pads formed on the spherical surface.

In view of the above problem, it is an object of the present invention to provide a semiconductor device having reliable electrical connection between a spherical semiconductor and a substrate and a method of manufacturing the same.

SUMMARY OF THE INVENTION

A semiconductor device of the present invention includes a spherical semiconductor, semiconductor elements such as transistor or diode etc. formed thereon, and contact pads that are electrically connected with the semiconductor elements. The semiconductor device also includes a substrate, and terminals formed on the surface of the substrate in which the spherical semiconductor will be mounted. The contact pads and the terminals are electrically connected via a fixative member, such as a solder, a conductive adhesive or an adhesive, arranged between the spherical semiconductor and the substrate. A high wettability area is formed at or around a central area of the spherical semiconductor where the substrate is closest. Specifically, the high wettability area is arranged on a surface of the contact pad. In such case, a wettability of the contact pad is higher than a wettability of the semiconductor material around the contact pad. Further, the contact pads may be processed to enhance the wettability with the fixative member. In addition, it is also preferable that a recess be formed in the substrate, at an area where the spherical semiconductor is mounted. In this construction, the positioning and retention of the spherical semiconductor is effected in a condition in which the spherical semiconductor is received by the recess. Therefore, the spherical semiconductor may be reliably mounted at a predetermined position on the substrate.

Additionally, it may be preferable to form a second high wettability area on the substrate at or around a central area of the substrate where the spherical semiconductor is mounted. The second high wettability area exhibits a higher wettability with the fixative material than that of a peripheral area around the high wettability area. Typically, the substrate where spherical comprises a base that is made from an electric non-conductive material such as glass, glass-epoxy or polycarbonate, terminals and a wiring pattern connecting the terminals which are made from conductive material. Preferably, the second high wettability area is arranged on a surface of the terminal, such that wettability of the terminal is higher than a wettability of the electric non-conductive substrate.

The method of mounting a spherical semiconductor comprises arranging the spherical semiconductor on the substrate, melting the fixative member arranged between the spherical semiconductor and the substrate, then, solidifying fixative material. In this case, the contact pad exhibits higher wettability with the fixative member than the peripheral area around the contact pad. To arrange the fixative member therebetween, for example, a layer of the fixative material is first applied to the contact pad of the spherical semiconductor.

In the above method, when the fixative material is melted, with the spherical semiconductor being arranged on the layer of the fixative material, a force is felt by the spherical semiconductor due to the surface tension of the melted fixative material and the difference in wettability between the high wettability area of the spherical semiconductor and the peripheral area. This force causes the spherical semiconductor and the contact pad to be urged into alignment with the terminal of the substrate. Thus, even if the position or orientation of the spherical semiconductor is somewhat misaligned from this terminal, the positioning of the spherical semiconductor will self-align when the fixative material is melted. Therefore, it is possible to reliably mount the spherical semiconductor at a predetermined position on the substrate.

To manufacture the present semiconductor device, a method similar to the former method is used. That is, a method of mounting a spherical semiconductor comprises of arranging the spherical semiconductor on the substrate and melting the fixative member arranged between the spherical semiconductor and the substrate, and solidifying the fixative material. In this case, the terminal exhibits higher wettability with the fixative member than the peripheral area of the terminal. To arrange the fixative member therebetween, for example, a layer of the fixative member is first applied to a contact pad of the spherical semiconductor. Then the spherical semiconductor is mounted to the substrate.

According to one aspect of the present invention during the manufacturing of the semiconductor device, as the spherical semiconductor is brought into contact with the fixative member a force created by the surface tension of the fixative material and the difference in wettability between the high wettability area of the spherical semiconductor and the peripheral area causes the spherical semiconductor and the contact pad to be urged into alignment with the terminal of the substrate. Thus, even if the position or orientation of the spherical semiconductor is somewhat deviated, such that the contact pads are not aligned with the terminal of the substrates, the positioning of the spherical semiconductor self aligns when the fixative member is melted. Therefore, it is possible to reliably mount the spherical semiconductor at a predetermined position on the substrate.

According to another aspect of the invention, the center of balance of the spherical semiconductor is set so as to direct the predetermined portion facing the substrate. In other words, the center of balance of the spherical semiconductor is arranged such that the predetermined portion is directed toward the terminals when it is arranged on the substrate. To change the center of balance to a certain position, the mass center of balance of the spherical semiconductor may be shifted by altering a density distribution of the wiring pattern and the contact pads formed on the surface of the spherical semiconductor. Alternatively, the center of balance of the spherical semiconductor may be shifted by varying a difference in the thickness of the layer of contact pad which is formed on the surface of the spherical semiconductor.

According to yet another aspect of the present invention, the substrate may include a recess in the area where the spherical semiconductor is mounted. With this embodiment, the spherical semiconductor may be reliably received and mounted in the recess area of the substrate. To manufacture such a semiconductor device constructed as described above, the spherical semiconductor may be positioned in the recess of the substrate, vibration imparted to the substrate so as to direct the contact pads into alignment with the terminal, and the spherical semiconductor and the substrate, coupled together with the fixative material.

In this embodiment, the center of balance of the spherical semiconductor is manipulated such that a predetermined part is aligned with the substrate terminals when it is arranged on the substrate, so that, even if the position or orientation not aligned with the terminal, the spherical semiconductor may move in the recess, in the predetermined direction according to the center of balance as vibrations are imparted to the substrate. Therefore, it is possible to mount the spherical semiconductor reliably at a predetermined position on the substrate.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings, wherein like reference symbols refer to like parts:

FIG. 5(A) is a sectional view of a semiconductor device according to the third embodiment of the present invention;

FIG. 5(B) is a diagram illustrating contact pads formed on the spherical semiconductor of FIG. 5(A);

FIG. 5(C) is a diagram illustrating terminals formed on the substrate of the semiconductor device of FIG. 5(A).

FIGS. 6(A) and 6(B) are side elevational views showing a process of mounting the spherical semiconductor on the substrate of the semiconductor device shown in FIG. 5(A).

DESCRIPTION OF THE PREFERRED EMBODIMENTS

Figure 1A:
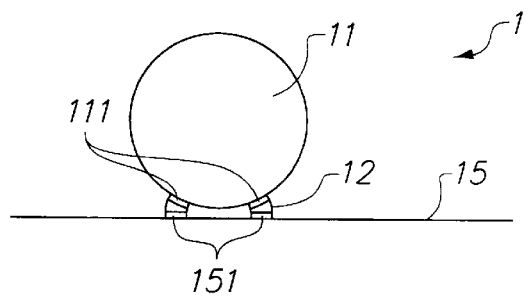
FIG. 1(A) is a side elevational view of a semiconductor device according to the first embodiment of the present invention.

A semiconductor device and a method of manufacturing a semiconductor device to which the present invention is applied will be described with reference to the drawings. The spherical semiconductor used in each of the following embodiments is the same as the spherical semiconductor described with reference to the prior art. Thus, the components which are common to those of the prior art are indicated by the same reference numerals, and the detailed description of such components will be omitted.

(First Embodiment)

Figure 1B:
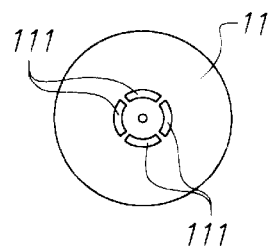
FIG. 1(B) is a diagram illustrating contact pads formed on the spherical semiconductor.
Figure 1C:
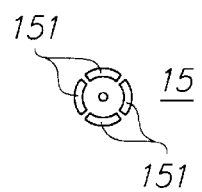
FIG. 1(C) is a diagram illustrating terminals formed on the substrate of FIG. 1(A).

Referring to FIGS. 1(A), 1(B) and 1(C), a semiconductor device 1 of this embodiment includes a spherical semiconductor 11 mounted on a substrate 15 with solder 12 (fixative material). On the spherical semiconductor 11, there are four contact pads 111 that are arranged in a circle pattern and that are electrically connected to the spherical semiconductor 11 and the substrate 15 when the spherical semiconductor 11 is mounted in a predetermined direction at a predetermined position on the substrate 15. In correspondence with these contact pads 111, four terminals 151 are also arranged in a similar circle pattern on the substrate 15.

In the semiconductor device 1 of this embodiment, the contact pads 111 of the spherical semiconductor 11 are preferably metallic, the surface of which consists of gold, copper or the like. The surface of each pad is treated preferably with oxygen plasma irradiation or plasma irradiation in a fluoride containing atmosphere to remove surface oxide or organic substance. Thus, the contact pads 111 of the spherical semiconductor 11 constitute a high wettability area which exhibits a markedly higher wettability with the solder 12 than the peripheral area i.e. the semiconductor material.

Figure 2A:
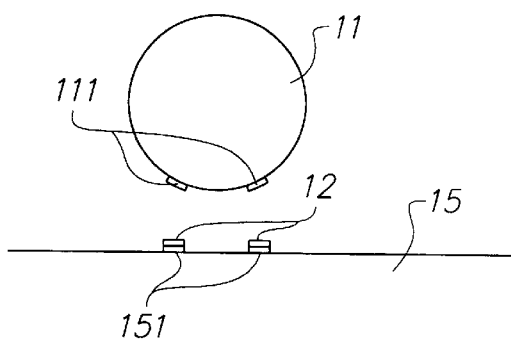
FIGS. 2(A) and 2(B) are side elevational views showing the process of mounting the spherical semiconductor on the substrate in the method of manufacturing the semiconductor device shown in FIG. 1.
Figure 2B:
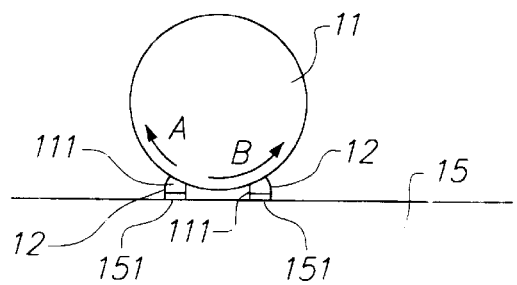

Thus, as described below with reference to FIGS. 2(A) and 2(B), when the spherical semiconductor 11 is mounted on the substrate 15, the difference in wettability between the contact pads and the peripheral area causes the spherical semiconductor to urged into alignment with the substrate. Specifically, when mounting the spherical semiconductor 11 on the substrate 15, layers of solder 12 are formed firstly, as shown in FIG. 2(A), at least on the terminals 151 of the substrate 15. Then, as shown in FIG. 2(B), the spherical semiconductor 11 is arranged on the layers of the solder 12, and then the solder 12 is melted. As a result, a bias is applied to the spherical semiconductor 11 generated by the surface tension of the molten solder 12 and the difference in wettability between the contact pad 111 of the spherical semiconductor 11 and the peripheral area. This bias causes the contact pads 111 of the spherical semiconductor 11, to be drawn to the molten solder 12. That is, the force causes the spherical semiconductor 11 to be rotated or translated into alignment with the terminals 151 of the substrate 15. Thus, even if the initial position or orientation of the spherical semiconductor 11 is not aligned with the terminals, for example, in the direction of the arrow A, the spherical semiconductor 11 rotates or moves in the direction of the arrow B until the bias acting between the contact pads 111 and the solder 12 is balanced. Thus, when the molten solder 12 is solidified, the spherical semiconductor 11 is mounted in alignment at a predetermined position on the substrate 15.

While in this embodiment the wettability with the solder 12 is enhanced by the plasma processing of the contact pads 111, it is also possible to perform plasma processing on the terminals 151 of the substrate 15 to enhance its wettability with the solder 12.

Further, while plasma processing of the contact pads 111 is preferable for enhancing its wettability with the solder 12 to be higher than the area surrounding the contacts pads, it is also possible, to perform fluororesin processing on the surrounding area or to form a solder resist layer thereon to reduce its wettability with the solder 12. In either case, what is desired is that the wettability of the contact pads 111 with the solder 12, is higher than that of the peripheral area.

Further, while in this embodiment a plurality of contact pads 111 and terminals 151 are formed in a circular pattern, it is also possible to use a ring-like continuous terminal.

Furthermore, while in this embodiment the spherical semiconductor 11 is fastened to the substrate 15 by using solder 12 as the fixative material, it is also possible to use, a conductive adhesive or an ordinary adhesive to fasten the spherical semiconductor 11 to the substrate 15.

(Second Embodiment)

Figure 3A:
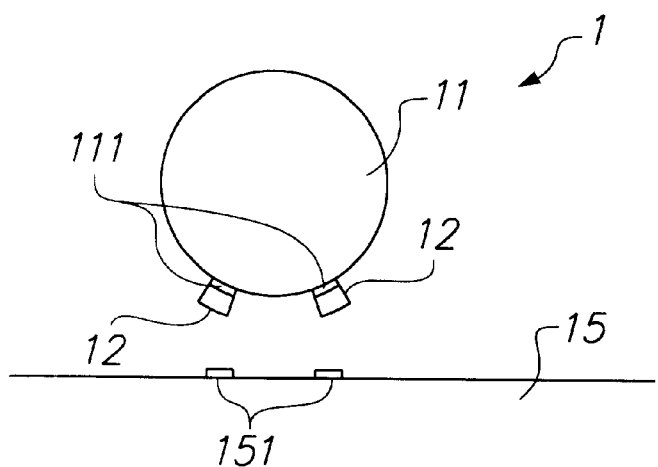
FIGS. 3(A) and 3(B) are side elevational views showing the process of mounting the spherical semiconductor on the substrate in the method of manufacturing the semiconductor device described in the second embodiment of the present invention.
Figure 3B:
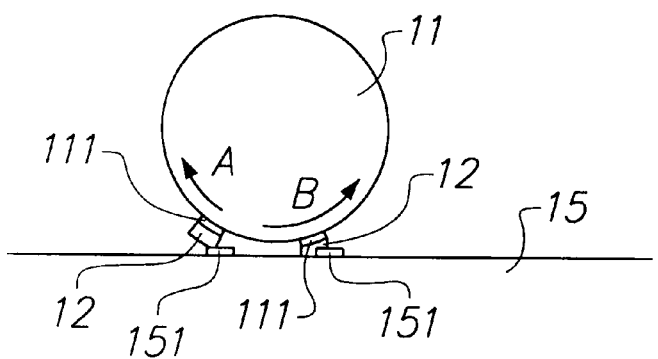

FIGS. 3(A) and 3(B) show another method of mounting the spherical semiconductor 11 on the substrate 15.

As described above, substrate 15 is typically made from an electric non-conductive material such as glass, glass-epoxy or polycarbonate. The terminals 151 are metallic, each having a surface consisting of gold, copper or the like. Each surface is treated with oxygen plasma irradiation or plasma irradiation in a fluoride containing atmosphere to remove surface oxide or organic substance. Thus, the terminals 151 of the substrate 15 provide a high wettability area which exhibits a markedly higher wettability with the solder 12 than that of the peripheral area (the substrate area surrounding the terminals 151).

Thus, as described below with reference to FIGS. 3(A) and 3(B), when the spherical semiconductor 11 is mounted on the substrate 15, the difference in wettability between the terminals and the peripheral area causes alignment of the contact pads 111 and terminals 151. Before mounting the spherical semiconductor 11 on the substrate 15, layers of the solder 12 are first formed on the contact pads 111 of the spherical semiconductor 11 as shown in FIG. 3(A). As shown in FIG. 3(B), the spherical semiconductor 11 is then arranged on the substrate 15 before the solder 12 is melted. As the solder 12 is melted, the surface tension of the molten solder 12 and the difference in wettability between the terminals 151 of the substrate 15 and the peripheral area, creates a force by which the molten solder 12 is drawn to the higher wettability of the terminals 151 of the substrate 15 Consequently, this force causes the spherical semiconductor 11 to rotate or move into alignment with the substrate terminals 151. Thus, even if the position or orientation of the spherical semiconductor 11 is somewhat misaligned, for example, in the direction of the arrow A, when the solder 12 is melted, the spherical semiconductor 11 rotates or moves until the force applied between the contact pads 111 and the solder 12 is balanced, and the contact pads 111 of the spherical semiconductor 11 are aligned with the terminals 151 of the substrate 15. Therefore, when the molten solder 12 is solidified, the spherical semiconductor 11 is reliably mounted at a predetermined position on the substrate 15.

While plasma processing is preferably performed on the terminals 151 of the substrate 15 to enhance their wettability with the solder 12, fluororesin processing may also be performed on the peripheral area or a layer of solder resist may be added to the peripheral area. This reduces the wettability of the peripheral area with the solder 12, thereby making the wettability of the terminals 151 of the substrate 15 with the solder 12 relatively higher than that of the peripheral area.

Further, while in this embodiment a plurality of contact pads 111 and 151 of the spherical semiconductor 11 and the substrate 15 are formed in a circular pattern, it is also possible to adopt continuous, ring-like terminals.

Furthermore, while in the above embodiment the spherical semiconductor 11 is fastened to the substrate 15 by using the solder 12 as a fixative material, the present invention is also applicable to a case in which the spherical semiconductor 11 is fastened to the substrate 15 by using, instead of the solder 12, a conductive adhesive or an ordinary adhesive.

[An Alternative of the First or Second Embodiments]

Figure 4:
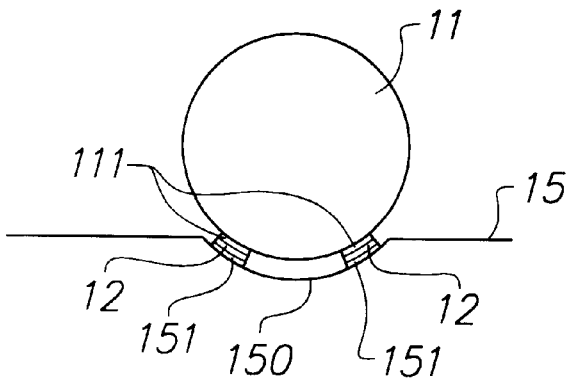
FIG. 4 is a sectional view of a semiconductor device according to a modification of the first and second embodiments of the present invention.
Figure 7:
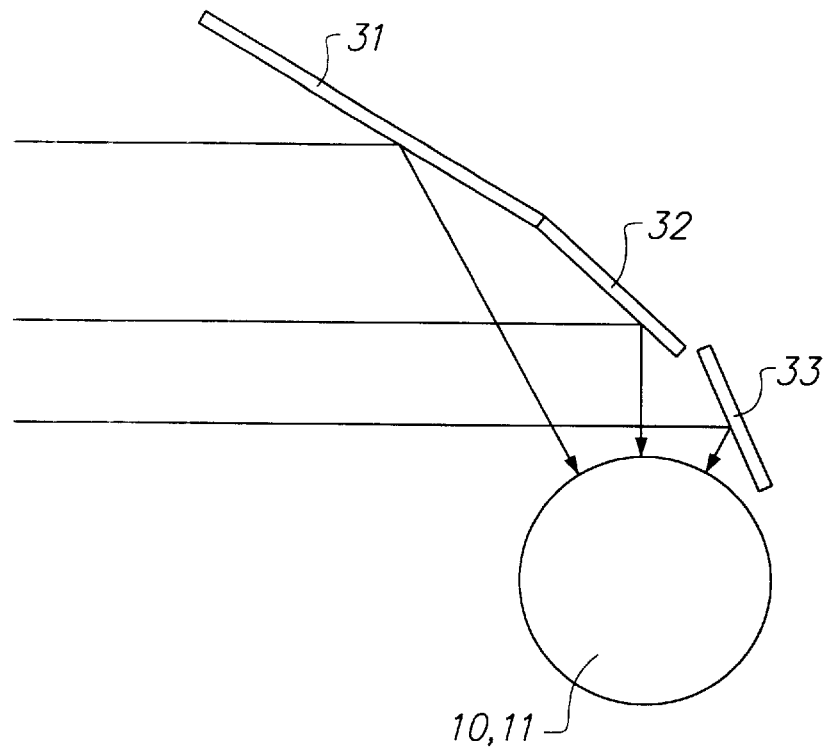
FIG. 7 shows a prior art method of exposure performed when manufacturing a spherical semiconductor.
Figure 8:
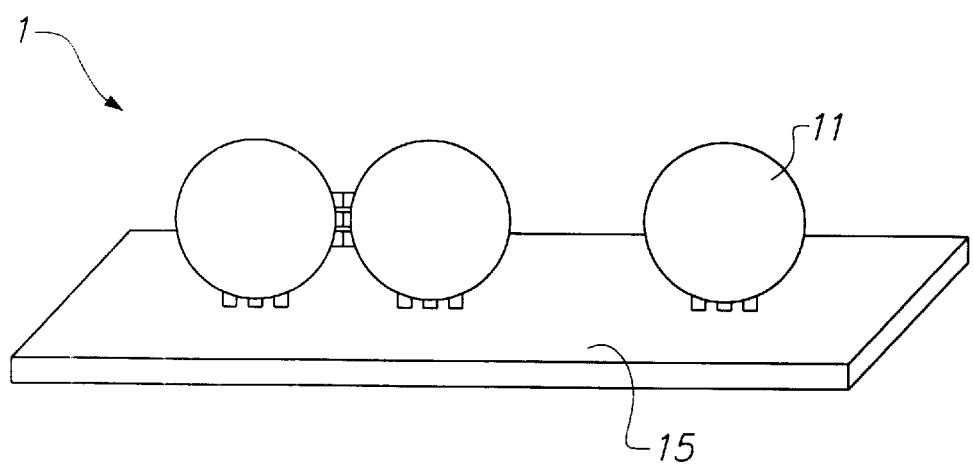
FIG. 8 is a diagram illustrating a prior art semiconductor device using the spherical semiconductor shown in FIG. 7.

FIG. 4 is a sectional view of a semiconductor device 1 according to this embodiment.

While in the first and second embodiments the area of the substrate 15 where the terminals 151 are formed is flat, it is also possible, as shown in FIG. 4, to form a recess 150 in the area of the substrate 15 where the spherical semiconductor 11 is mounted, with the terminals 151 being formed in this recess 150.

Thus, in this embodiment, the alignment of the spherical semiconductor 11 is similarly adjusted by the surface tension of the molten solder 12, while the positioning and retention of the spherical semiconductor 11 is effected in a condition in which it is received by the recess 150.

(Third Embodiment)

FIG. 5(A) is a sectional view of a semiconductor device according to the third embodiment of the present invention;

FIG. 5(B) is a diagram illustrating contact pads formed on the spherical semiconductor used in this semiconductor device 1; and FIG. 5(C) is a diagram illustrating terminals formed on the substrate used in this semiconductor device 1. FIGS. 6(A) and 6(B) are sectional views showing the process of mounting the spherical semiconductor on the substrate in the method of manufacturing the semiconductor device of this embodiment.

Referring to FIGS. 5(A), 5(B) and 5(C), the spherical semiconductor 11 is mounted on the substrate 15 by means of the solder 12 (fixative material). On this spherical semiconductor device 11, one contact pad 111 is formed at a position closest to the substrate 15 when the spherical semiconductor 11 is mounted at a predetermined position and in a predetermined direction on the substrate 15. Surrounding this contact pad 111, are four contact pads 111 formed in a circular pattern. In correspondence with these other pads 111, there is formed, on the substrate 15a, a similar pattern of terminals 151 that compliment the contact pads 111.

In the semiconductor device 1 of this embodiment, the center of balance of the spherical semiconductor 11 is shifted such that the area where the contact pads 111 are formed is directed downward when the spherical semiconductor 11 is arranged on the substrate 15. For example, in the area of the spherical semiconductor 11 where the contact pads 111 are located, the contact pads 111 and the wiring pattern 20 that electrically connects the contact pads with semiconductor element 25 are formed with a higher density than that of the other area so that the center of balance may be shifted toward the area where the spherical semiconductor 11 is electrically connected to the substrate 15 (the area where the contact pads 111 are formed). Further, in the area of the spherical semiconductor 11 where the contact pads 111 are located, the contact pads 111 and the wiring pattern 20 may be formed thicker than other areas. Additionally, the surface of contact pads 111 is plated with gold which adds to the mass center of balance being shifted toward that area of the spherical semiconductor.

Thus, in this embodiment, the center of balance of the spherical semiconductor 11 is shifted, so that, when it is arranged on the substrate 15, the contact pads 111 are directed toward the substrate terminals. Therefore, the spherical semiconductor 11 can be reliably mounted at a predetermined position on the substrate 15 in a stable manner.

Further, in this embodiment, a recess 150 may be formed in the area of the surface of the substrate 15 where the spherical semiconductor 11 is mounted, such that the terminals 151 are formed in this recess 150. The recessed area 150 is dimensioned to receive the spherical semiconductor 11, so that the spherical semiconductor 11 can be reliably mounted at a predetermined position on the substrate 15.

Further, by utilizing the fact that the recess 150 is formed in the surface of the substrate 15 and that the center of balance of the spherical semiconductor 11 is shifted, it is possible to mount the spherical semiconductor 11 at a predetermined position and in a predetermined direction in the manner described below. That is, as shown in FIG. 6(A), substrate 15, includes terminals 151, each surface of which is plated with the solder 12. The spherical semiconductor 11 is arranged in the recess 150, as shown. As shown in FIG. 6(B), micro-vibrations may be imparted to the substrate 15 to thereby urge the center of balance of the spherical semiconductor 11 to be directed downward. Accordingly, the contact pads 111 of the spherical semiconductor 11 move into alignment with the terminals 151 of the substrate 15, and the solder 12 is melted and solidified.

In this method, when the spherical semiconductor 11 is arranged on the substrate 15, even if its position or orientation is somewhat deviated in the direction of the arrow A, the vibrations imparted to the substrate 15 enable the spherical semiconductor 11 to be urged into a predetermined direction according to its center of balance in the recess 150 e.g. as indicated by the arrow B. Thus, the spherical semiconductor 11 can be reliably mounted at a predetermined position on the substrate 15.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device comprising:
   a spherical semiconductor comprising a semiconductor material and a semiconductor element formed thereon;
   a substrate having a recess formed thereon and in which the spherical semiconductor is received, a width of the recess being narrower than a width of the spherical semiconductor;
   a first high wettability area formed on the spherical semiconductor, the first high wettability area exhibiting higher wettability than that of an area surrounding the first high wettability area with respect to a fixative member;
   at least one contact pad formed on, and coinciding with, the first high wettability area;
   a fixative member coupled to the at least one contact pad; and
   at least one terminal formed on the substrate, located in the recess, and electrically connected to the at least one contact pad via the fixative member;
   the semiconductor device further comprising a second high wettability area formed on the substrate at or around a central area of the substrate to which the spherical semiconductor is closest, the second high wettability area exhibiting a higher wettability with the fixative material than that of a peripheral area thereof; and
   wherein the difference in wettability between the first high wettability area and its surrounding area and between the second high wettability area and its peripheral area causes the first and second high wettability areas to be urged into alignment with each other.

2. The semiconductor device of claim 1, wherein the fixative member is selected from a group of a solder material, a conductive adhesive and an adhesive material.

3. The semiconductor device of claim 1, wherein the at least one contact pad is electrically connected to the semiconductor element.

4. The semiconductor device of claim 3, wherein the substrate comprises an electric non-conductive member and the at least one terminal is formed thereon; and
   the second high wettability area coinciding with the at least one terminal, the second high wettability area exhibiting a higher wettability with the fixative member than that of the non conductive member.

5. The semiconductor device of claim 1, further comprising at least one metal terminal formed on the spherical semiconductor, wherein the first high wettability area substantially coincides with the at least one metal terminal, wherein the area surrounding the first high wettability area includes silicon, and wherein the fixative member includes solder.

6. The semiconductor device of claim 1, further comprising at least one metal terminal formed on the spherical semiconductor, wherein the first high wettability area substantially coincides with the at least one metal terminal, and wherein each surface of the at least one metal terminal has been treated with oxygen plasma irradiation or plasma irradiation in a fluoride containing atmosphere.

7. The semiconductor device of claim 1, wherein the area surrounding the first high wettability area has undergone fluororesin processing.

8. The semiconductor device of claim 1, wherein the area surrounding the first high wettability area includes a solder resist layer.

9. The semiconductor device of claim 1, wherein the area surrounding the second high wettability area has undergone fluororesin processing.

10. The semiconductor device of claim 1, wherein the area surrounding the second high wettability area includes a solder resist layer.

11. A semiconductor device comprising:

a spherical semiconductor comprising a semiconductor material and a semiconductor element formed thereon;

a substrate; and a fixative member coupling the spherical semiconductor and the substrate, the spherical semiconductor having a predetermined portion coupled to the substrate by the fixative material, a center of gravity of the spherical semiconductor being located so that when the spherical semiconductor is arranged on the substrate the predetermined portion is directed toward the substrate.

12. The semiconductor device of claim 11, further comprising at least one contact pad formed about the predetermined portion.

13. The semiconductor device of claim 12, wherein the center of gravity of the spherical semiconductor is deviated by a density distribution of wiring patterns formed on the spherical semiconductor and the contact pads.

14. The semiconductor device of claim 12, wherein the center of gravity of the spherical semiconductor is deviated by a difference in layer thickness of wiring patterns formed on the spherical semiconductor and those of the contact pads.

15. A semiconductor device of claim 12, wherein the substrate includes a recess area, the spherical semiconductor being mounted in the recess area.

* * * * *